(12) United States Patent
Törnqvist et al.

(10) Patent No.: US 11,854,588 B2
(45) Date of Patent: Dec. 26, 2023

(54) MULTIPLE TIME PROGRAMMABLE MEMORY USING ONE TIME PROGRAMMABLE MEMORY AND ERROR CORRECTION CODES

(71) Applicant: MURATA MANUFACTURING CO., LTD., Nagaokakyo (JP)

(72) Inventors: Vesa Törnqvist, Helsinki (FI); Teemu Salo, Riihimäki (FI)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 157 days.

(21) Appl. No.: 17/696,475

(22) Filed: Mar. 16, 2022

(65) Prior Publication Data
US 2022/0301631 A1    Sep. 22, 2022

(30) Foreign Application Priority Data
Mar. 18, 2021 (FI) .................................. 20215298

(51) Int. Cl.
*G11C 11/34*    (2006.01)
*G11C 16/10*    (2006.01)
*G11C 16/08*    (2006.01)
*G11C 16/26*    (2006.01)
*G11C 17/12*    (2006.01)
*G11C 17/18*    (2006.01)
*H03M 13/11*    (2006.01)

(52) U.S. Cl.
CPC ............ *G11C 16/102* (2013.01); *G11C 16/08* (2013.01); *G11C 16/26* (2013.01); *G11C 17/12* (2013.01); *G11C 17/18* (2013.01); *H03M 13/1174* (2013.01)

(58) Field of Classification Search
CPC ........ G11C 13/102; G11C 13/08; G11C 13/26
USPC ...................................................... 365/185.03
See application file for complete search history.

(56) References Cited

U.S. PATENT DOCUMENTS 6,728,137 B1    4/2004   Lin
8,294,940 B1   10/2012   Mcnall et al.
8,810,846 B1    8/2014   McNall et al.
(Continued)

FOREIGN PATENT DOCUMENTS

WO    WO 2016/179309 A1    11/2016

OTHER PUBLICATIONS

Finnish Search Report dated Oct. 15, 2021 corresponding to Finnish Patent Application No. 20215298.
(Continued)

*Primary Examiner* — Vu A Le
(74) *Attorney, Agent, or Firm* — SQUIRE PATTON BOGGS (US) LLP

(57) ABSTRACT

The present invention relates to the field of digital memory, and in particular to a multiple-time programmable (MTP) memory employing error correction codes (ECC), the MTP memory being made up of one-time programmable (OTP) memory modules. Pointers to the memory address of currently in-use OTP memory blocks in use for each virtual MTP memory block are stored in OTP memory with an error correcting code. The pointers encode the memory addresses according to a scheme that ensure that only bit changes in a single direction are required in both the pointer data and the error correction code when the memory address is incremented.

20 Claims, 2 Drawing Sheets

(56) References Cited

U.S. PATENT DOCUMENTS

| | | | |
|---|---|---|---|
| 2012/0066437 A1* | 3/2012 | Chen | G11C 16/102 |
| | | | 711/E12.008 |
| 2015/0138866 A1 | 5/2015 | Kawasumi | |
| 2016/0276043 A1* | 9/2016 | Chung | G11C 17/165 |
| 2016/0321480 A1* | 11/2016 | Hamlin | G16Z 99/00 |
| 2016/0328289 A1 | 11/2016 | Zhang et al. | |

OTHER PUBLICATIONS

G. Zemor et al., "Error-correcting WOM-codes," In: IEEE Transactions on Information Theory, IEEE, May 1991, vol. 37, No. 3, pp. 730-734.

Search Report dated Jul. 28, 2022, corresponding to European Patent Application No. 22157204.

Hamming, R.W. (1950), "Error Detecting and Error Correcting Codes," Bell System Technical Journal, vol. 29, No. 2, pp. 147-160, Apr. 1950.

* cited by examiner

MULTIPLE TIME PROGRAMMABLE MEMORY USING ONE TIME PROGRAMMABLE MEMORY AND ERROR CORRECTION CODES

TECHNICAL FIELD

The present invention relates to the field of digital memory, and in particular to a multiple-time programmable (MTP) memory employing error correction codes (ECC), the MTP memory being made up of one-time programmable (OTP) memory modules.

BACKGROUND

One-time programmable (OTP) memory, also referred to as programmable read-only memory (PROM), is a type of programmable non-volatile digital memory in which each memory bit is programmable from a 0 state to a 1 state, or from a 1 state to a 0 state. One a bit has been programmed, it cannot be unprogrammed, i.e. it cannot be reprogrammed back to a 0 state from a 1 stage or a 1 state from a 0 state. This functionality is typically provided by a floating-gate, a fuse or an antifuse, which is programmed by charging the gate, blowing the fuse, converting an electrically conductive path to a electrically non-conductive path, or by blowing the antifuse, converting an electrically non-conductive path to an electrically conductive path. If floating gate OTP is used, the whole memory can be erased by ultraviolet light.

Multi-time programmable (MTP) memory is also a type of non-volatile digital memory, but unlike OTP memory, it can be electrically reprogrammed in order to store different data. It is known in the art that MTP memory can be formed from OTP memory by providing multiple OTP memory banks. While each bit of the OTP memory can only be programmed once, the MTP memory maintains one or more pointers to the parts of the OTP memory that are currently in use. When the MTP memory is reprogrammed, a new section of the OTP memory is programmed and the MTP memory pointer is updated to point to the new section of the OTP memory.

Error corrections codes (ECC) are codes that can be used to detect and correct errors in stored data. One type of error correcting codes is Hamming codes, which are well-known in the art and are described in Hamming, R. W. (1950), *Error Detecting and Error Correcting Codes*, Bell System Technical Journal, 29: 147-160, doi:10.1002/j.1538-7305.1950.tb00463.x.

SUMMARY

According a first aspect of the invention, multiple-time programmable memory (MTP) is provided. The MTP memory comprises one-time programmable (OTP) memory and a plurality of virtual MTP memory blocks, and the OTP memory comprises a plurality of OTP memory blocks. A plurality of the OTP memory blocks are reserved for each virtual MTP memory block, and at any given time, each virtual MTP memory block is associated with one of the plurality of OTP memory blocks that are reserved for the virtual MTP memory block, wherein the current data of the virtual MTP memory block is stored in the associated OTP memory block. For each virtual MTP memory block, a pointer that identifies the OTP memory block that is associated with the virtual MTP memory block is stored elsewhere in the OTP memory, such as in a memory address table. The MTP memory is configured to program a first virtual MTP memory block of the plurality of virtual MTP memory blocks with new data by:

programming a previously unprogrammed OTP memory block of the OTP memory blocks that are reserved for the first virtual MTP memory block with the new data; and updating the pointer of the OTP memory block that is associated with the first virtual MTP memory block to identify the newly programmed OTP memory block;

The pointers of the OTP memory blocks that are associated with the of the virtual MTP memory blocks are stored with an error correcting code, and the encoding scheme of the pointers is such that incrementing the pointer requires only bit changes in both the pointer data and the error correcting code from one of 0 to 1 or 1 to 0 depending on the type of OTP memory.

According to a second aspect of the invention, a method for updating or storing new data in a multiple-time programmable (MTP) memory is provided. The MTP memory comprises one-time programmable (OTP) memory and a plurality of virtual MTP memory blocks, and the OTP memory comprising a plurality of OTP memory blocks. A plurality of the OTP memory blocks are reserved for each virtual MTP memory block and at any given time, each virtual MTP memory block is associated with one of the plurality of OTP memory blocks that are reserved for the virtual MTP memory block, wherein the current data of the virtual MTP memory block is stored in the associated OTP memory block. For each virtual MTP memory block, a pointer that identifies the OTP memory block associated with the virtual MTP memory block is stored elsewhere in the OTP memory, such as a memory address table. The method comprises:

programming a previously unprogrammed OTP memory block of the OTP memory blocks that are reserved for the first virtual MTP memory block with the data; and updating the pointer of the OTP memory block that is associated with the first virtual MTP memory block to identify the newly programmed OTP memory block;

The pointers of the OTP memory blocks that are associated with the of the virtual MTP memory blocks are stored with an error correcting code, and the encoding scheme of the pointers is such that incrementing the pointer requires only bit changes in both the pointer data and the error correcting code from one of 0 to 1 or 1 to 0 depending on the type of OTP memory.

In the MTP memory or the method, the error correcting code may be a repetition code, such as a (2,1) repetition code or a (3,1) repetition code.

The pointers may be encoded such that the most-significant or least-significant bit indicates the memory address.

Alternatively, the error correcting code may be a Hamming code.

The data stored in the MTP memory may also be stored with an error correction code, and the error correction code used for the data stored in the MTP memory may also be a Hamming code.

Before programming a previously unprogrammed OTP memory block, the MTP memory may further configured to check, or the method may further comprise checking whether the OTP memory block that is currently associated with the first virtual MTP memory block can be reprogrammed to store the new data using only bit changes from one of 0 to 1 or 1 to 0 and, if so, reprogramming the OTP memory block that is currently associated with the first virtual MTP memory block to store the new data without programming a previously unprogrammed OTP memory block or updating the pointer.

The data stored in the MTP memory may also be also stored with an error correction code and wherein the MTP memory is further configured to check whether the error correction code of the new data can be updated using only bit changes from one of 0 to 1 or 1 to 0.

Updating the pointer of the OTP memory block that is associated with the first virtual MTP memory block further comprises reprogramming the OTP memory storing the pointer error correction code to update the error correction code of the updated pointer.

The pointers may identify the memory addresses of the OTP memory blocks associated with the virtual MTP memory blocks.

DETAILED DESCRIPTION

According to an embodiment of the present invention, MTP memory 100 can be formed from OTP memory by providing multiple OTP memory banks 110, 120, 130, 140. While each bit of the OTP memory can only be programmed once, the MTP memory maintains one or more pointers to the parts of the OTP memory that are currently in use.

Figure 1:
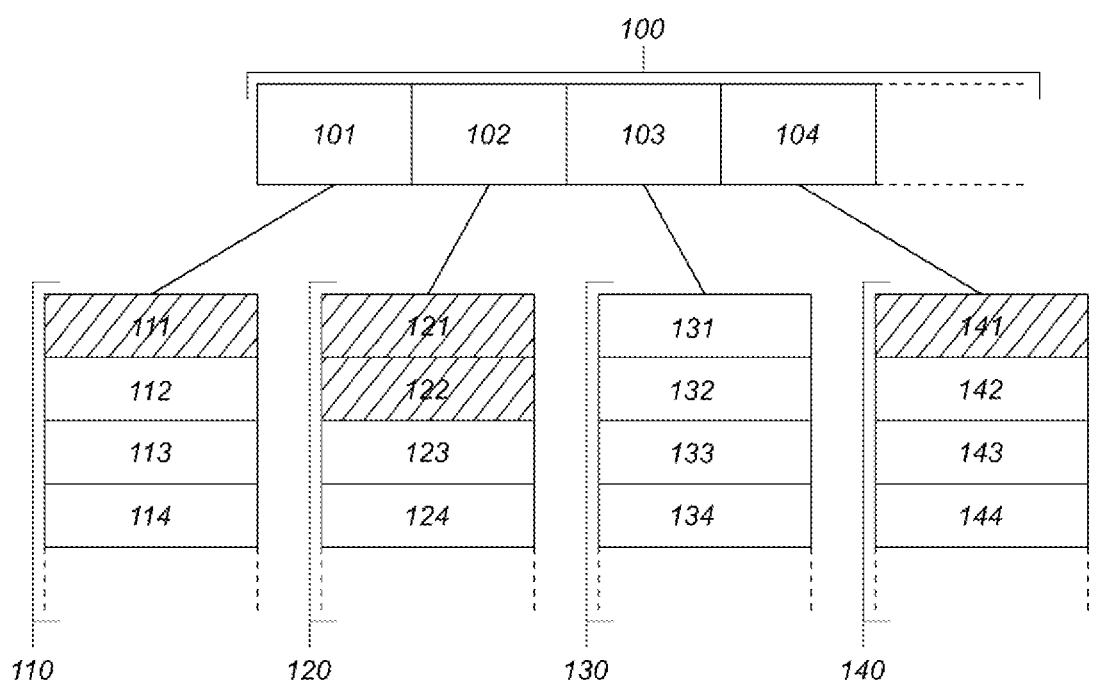
FIG. 1 shows a multiple time programmable memory of the present invention.

As shown in FIG. 1, MTP memory 100 is formed of virtual MTP memory blocks 101, 102, 103, 104. Each virtual MTP memory block 101-104 corresponds to one of the OTP memory blocks 111-114, 121-124, 131-134, 141-144. The memory also includes a separate OTP memory block (not shown) which maintains a record, such as a memory address table, of which OTP memory block 111-114, 121-124, 131-134, 141-144 corresponds to and is in use for each virtual MTP memory block 101-104. The relationship between MTP memory pointers and actual OTP memory addresses, i.e. the encoding of OTP memory addresses in the MTP memory pointers, may also be stored in the memory address table or elsewhere in OTP memory.

The arrangement of memory blocks depicted in FIG. 1 is a logical and not necessarily physical arrangement. OTP memory blocks 111-114, 121-124, 131-134, 141-144 are shown in separate groups 110, 120, 130, 140 in FIG. 1, but the OTP memory blocks 111-114, 121-124, 131-134, 141-144 may be provided in separate memory modules, provided in a single memory module, or split across multiple memory modules. The OTP memory used to store the memory address table may be part of the same OTP memory module as the memory blocks 111-114, 121-124, 131-134, 141-144 or may be provided separately.

When the MTP memory 100 is reprogrammed, a new OTP memory block 111-114, 121-124, 131-134, 141-144 is programmed and the MTP memory pointer is updated to point to the newly programmed OTP memory block 111-114, 121-124, 131-134, 141-144. In FIG. 1, already-programmed memory blocks are indicated by hatching. The first, i.e. uppermost, unhatched block is the present OTP memory block 111-114, 121-124, 131-134, 141-144 that is in use for the corresponding virtual MTP memory block 101-104. Thus, virtual MTP memory block currently corresponds to OTP memory block 112, virtual MTP memory block 102 to OTP memory block 123, virtual MTP memory block 103 to OTP memory block 131, and virtual MTP memory block 104 to OTP memory block 142.

Before programming a new OTP memory block 111-114, the MTP memory 100 may determine whether it is possible to reprogram the current OTP memory block with the new data, i.e. if the new data and requires only 0 to 1 or 1 to 0 bit changes (depending on the type of OTP memory) from the existing data. If so, the current OTP memory block is updated instead of programming a new OTP memory block or changing the pointer.

A simple way to representing the MTP memory pointer in memory is to program a continuous series of bits from 0 to 1, starting from the least significant bit (LSB) and where the location of the most-significant 1 bit corresponds to the memory address. Alternatively, starting from the most significant bit, the locations of the least-significant 1 bit may correspond to the memory address. Where the OTP memory is fuse-based instead of antifuse-based, the most or least significant zero bit may be similarly used. This allows the address pointer to be implemented in OTP and incremented by simply programming the next bit, as required. However, this solution cannot be used with a Hamming code ECC, since the change in the ECC caused by the change in the pointer requires the bits be changed from 1 to 0, which cannot be done in OTP memory, as shown in the table below.

| Address | Pointer Data (6 bit ECC, 16 bits of data) |
|---|---|
| 0 | 100011__0000000000000001 |
| 1 | 000110__0000000000000011 |
| 2 | 100000__0000000000000111 |
| 3 | 100111__0000000000001111 |
| 4 | 001110__0000000000011111 |

Typically, ECCs are used when storing data in the MTP memory; however, the correctness of the bits of the MTP memory pointer is even more important than the correctness of the data bits, since a single incorrect bit in the MTP memory pointer bits can result in an incorrect portion of the OTP being read or in the inability to read any data when the MTP memory is accessed.

In a first embodiment of the invention, errors in the pointer may therefore be detected by duplicating the pointer in memory, i.e. by using a (2,1) repetition code, since this does not require changing any bit's state from 1 to 0; however simple duplication is only capable of detecting an error in the pointer data, it is not capable of correcting the data since it is not derivable whether the data in the original or the duplicate pointer data is incorrect.

In a second embodiment of the invention, a (3,1) repetition code is used as the ECC for the memory addresses stored in the memory address table. As with the (2,1) repetition code, the (3,1) repetition code also does not require changing the state of any bit from 1 to 0, when following the conventional address scheme described above. However, unlike the (2,1) repetition code the pointer, the (3,1) repetition code is capable of both error detection and error correction.

Both duplicating and triplicating the data, i.e. using (2,1) or (3,1) repetition codes, satisfy the requirement for monodirectional bit changes when the addresses are encoded by the most (or least) significant programmed bit and can therefore be used with OTP memory, but due to their inefficiency compared to other ECCs, such as Hamming codes, they are generally not used for the data stored in the MTP memory itself. Therefore, implementing a repetition code only for the memory addresses stored in the memory address tables requires additional logic in the device in order to analyse the ECCs of the memory addresses. It is preferable therefore to use a Hamming code, or other similar, more efficient code, that is also used as the ECC for the data stored in the MTP memory.

Thus, in a third embodiment of the invention, instead of using the most-significant (or least-significant for fuse-based OTP memory) programmed bit in the pointer data to signify the pointer address, as in the table above, the possible bit combinations for the pointer data are chosen such that incrementing the pointer address requires only changes of the data from 0 to 1 in both the pointer data and the ECC. An example of such an address scheme is shown in the following table:

| Address | Pointer Data (6 bit ECC, 16 bits of data) |
|---------|-------------------------------------------|
| 0       | 000000_0000000000110110                   |
| 1       | 010000_1100100000110110                   |
| 2       | 010010_1111100000110111                   |
| 3       | 011010_1111110011110111                   |
| 4       | 011110_1111111111111111                   |

As can be seen in the table, as the address and pointer are incremented, i.e. as the address and pointer are updated to refer to the next previously-unprogrammed OTP memory block, only bit changes from 0 to 1 are required.

The encoding scheme for the memory addresses in the pointer data may be determined by performing a search across the space of possible pointer data bits that satisfy the two conditions that changes in the pointer data and the ECC require only bit changes in a single direction. The search may be implemented, for example, with a computer and for a person skilled in the art, creating code that searches suitable combinations of pointer data bits and error correction codes is a simple programming task. The encoding scheme and length of the pointer data may be chosen to accommodate the required number of address encodings and the search for the claimed combinations of pointer data bits and error correction codes needs to be conducted only once for any selected pointer data bit configuration and ECC variant. For example, in the above data, the encoding scheme shown enables the encoding of five addresses. If more addresses are to be used, then a different encoding scheme or larger number of pointer data bits should be used.

Figure 2:
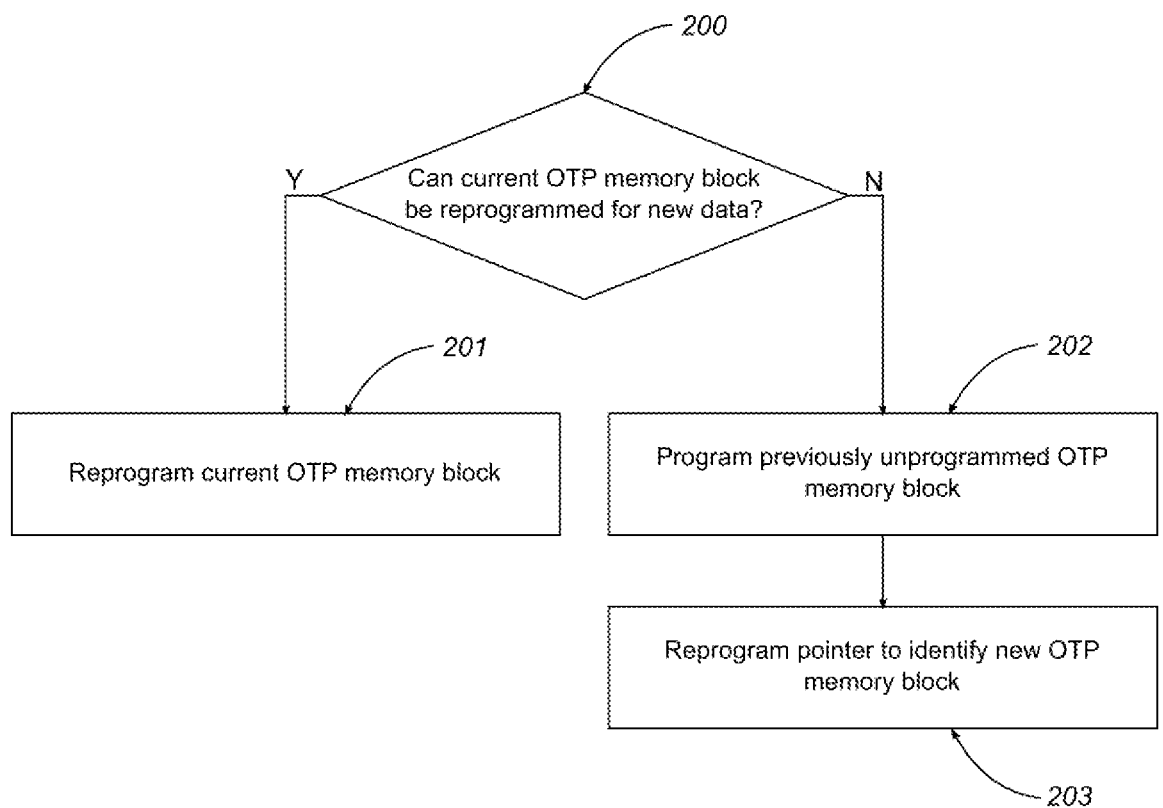
FIG. 2 shows a method of programming the multiple time programmable memory of the present invention.

FIG. 2 depicts a method of reprogramming the MTP memory of the present invention with new data. Steps 200 and 201 are optional and the method may instead begin at step 202. At step 200, it is determined whether the existing OTP memory block that is associated with the virtual MTP memory block can be updated to store the new data, i.e. does the change to bits of the memory block require only changes from 0 to 1 or 1 to 0, depending on the type of memory. If so, the new data is stored in the MTP memory by reprogramming the existing OTP memory block at step 201. When the data stored within the MTP memory is also stored with an error correcting code, the check at step 200 may also include checking with the error correcting code for the new data also satisfies the criterion that only a single type of bit change, 0 to 1 or 1 to, depending on the OTP memory type, may be made. The current OTP memory block will only be updated if the changes in both the data and error correcting code require a single type of bit change.

At step 202—either when it is determined that the current OTP memory block cannot b reprogrammed, or when step 200 is not present—a previously unprogrammed OTP memory block is programmed with the new data. Where the data is stored in the MTP memory with error correcting codes, this step also includes programming the OTP memory block with the error correcting code. At step 203, the pointer data, which identifies the current OTP memory block that is associated with the virtual MTP memory block, is updated to identify the new OTP memory block as being associated with the virtual MTP memory block, as described above.

The invention claimed is:

1. Multiple-time programmable memory (MTP) comprising one-time programmable (OTP) memory and a plurality of virtual MTP memory blocks, the OTP memory comprising a plurality of OTP memory blocks, wherein:
   a plurality of the OTP memory blocks are reserved for each virtual MTP memory block;
   at any given time, each virtual MTP memory block is associated with one of the plurality of OTP memory blocks that are reserved for the virtual MTP memory block, wherein the current data of the virtual MTP memory block is stored in the associated OTP memory block;
   for each virtual MTP memory block, a pointer that identifies the OTP memory block that is associated with the virtual MTP memory block is stored elsewhere in the OTP memory; and
   the MTP memory is configured to program a first virtual MTP memory block of the plurality of virtual MTP memory blocks with new data by:
      programming a previously unprogrammed OTP memory block of the OTP memory blocks that are reserved for the first virtual MTP memory block with the new data; and
      updating the pointer of the OTP memory block that is associated with the first virtual MTP memory block to identify the newly programmed OTP memory block;
   wherein the pointers of the OTP memory blocks that are associated with the virtual MTP memory blocks are stored with an error correcting code, and wherein the encoding scheme of the pointers is such that incrementing the pointer requires only bit changes in both the pointer data and the error correcting code from one of 0 to 1 or 1 to 0 depending on the type of OTP memory.

2. A method for updating or storing new data in a multiple-time programmable (MTP) memory, the MTP memory comprising one-time programmable (OTP) memory and a plurality of virtual MTP memory blocks, the OTP memory comprising a plurality of OTP memory blocks, wherein:
   a plurality of the OTP memory blocks are reserved for each virtual MTP memory block;
   at any given time, each virtual MTP memory block is associated with one of the plurality of OTP memory blocks that are reserved for the virtual MTP memory block, wherein the current data of the virtual MTP memory block is stored in the associated OTP memory block;
   for each virtual MTP memory block, a pointer that identifies the OTP memory block associated with the virtual MTP memory block is stored elsewhere in the OTP memory;
   the method comprising:
      programming a previously unprogrammed OTP memory block of the OTP memory blocks that are reserved for the first virtual MTP memory block with the data; and updating the pointer of the OTP memory block that is associated with the first virtual MTP memory block to identify the newly programmed OTP memory block;

wherein the pointers of the OTP memory blocks that are associated with the of the virtual MTP memory blocks are stored with an error correcting code, and wherein the encoding scheme of the pointers is such that incrementing the pointer requires only bit changes in both the pointer data and the error correcting code from one of 0 to 1 or 1 to 0 depending on the type of OTP memory.

3. The MTP memory of claim 1, wherein the error correcting code is a repetition code.

4. The MTP memory of claim 3, wherein the error correcting code is a (2,1) repetition code.

5. The MTP memory of claim 3, wherein the error correcting code is a (3,1) repetition code.

6. The MTP memory of claim 1, wherein the pointers are encoded such that the most-significant or least-significant bit indicates the memory address.

7. The MTP memory of claim 1, wherein the error correction code is also used as the error correction code for the data stored in the MTP memory.

8. The MTP memory of claim 7, wherein incrementing the pointer requires at least one bit change in the error correcting code.

9. The MTP memory of claim 7, wherein the error correcting code is a Hamming code.

10. The MTP memory of claim 9, wherein the data stored in the MTP memory is also stored with an error correction code, and wherein the error correction code used for the data stored in the MTP memory is also a Hamming code.

11. The MTP memory of claim 1, wherein before programming a previously unprogrammed OTP memory block, the MTP memory is further configured to check whether the OTP memory block that is currently associated with the first virtual MTP memory block can be reprogrammed to store the new data using only bit changes from one of 0 to 1 or 1 to 0 and, if so, reprogramming the OTP memory block that is currently associated with the first virtual MTP memory block to store the new data without programming a previously unprogrammed OTP memory block or updating the pointer.

12. The MTP memory of claim 11, wherein the data stored in the MTP memory is also stored with an error correction code and wherein the MTP memory is further configured to check whether the error correction code of the new data can be updated using only bit changes from one of 0 to 1 or 1 to 0.

13. The MTP memory of claim 1, wherein updating the pointer of the OTP memory block that is associated with the first virtual MTP memory block further comprises reprogramming the OTP memory storing the pointer error correction code to update the error correction code of the updated pointer.

14. The MTP memory of claim 1, wherein the pointers identify the memory addresses of the OTP memory blocks associated with the virtual MTP memory blocks.

15. The method of claim 2, wherein the error correcting code is a repetition code.

16. The method of claim 15, wherein the error correcting code is a (2,1) repetition code.

17. The method of claim 15, wherein the error correcting code is a (3,1) repetition code.

18. The method of claim 2, wherein the pointers are encoded such that the most-significant or least-significant bit indicates the memory address.

19. The method of claim 2, wherein the error correction code is also used as the error correction code for the data stored in the MTP memory.

20. The method of claim 19, wherein incrementing the pointer requires at least one bit change in the error correcting code.

* * * * *